US010461091B2

(12) United States Patent
Kim et al.

(10) Patent No.: US 10,461,091 B2
(45) Date of Patent: Oct. 29, 2019

(54) NAND FLASH MEMORY DEVICE HAVING FACING BAR AND METHOD OF FABRICATING THE SAME

(71) Applicant: DOSILICON CO., LTD., Shanghai (CN)

(72) Inventors: Jin Ho Kim, Hwaseong-si (KR); Tae Gyoung Kang, Yongin-si (KR)

(73) Assignee: DOSILICON CO., LTD., Shanghai (CN)

( * ) Notice: Subject to any disclaimer, the term of this patent is extended or adjusted under 35 U.S.C. 154(b) by 16 days.

(21) Appl. No.: 15/843,516

(22) Filed: Dec. 15, 2017

(65) Prior Publication Data
US 2019/0148388 A1 May 16, 2019

(30) Foreign Application Priority Data

Nov. 15, 2017 (KR) .......................... 10-2017-0152296

(51) Int. Cl.
*H01L 29/66* (2006.01)
*H01L 27/115* (2017.01)
*H01L 21/82* (2006.01)
*H01L 27/1157* (2017.01)
*H01L 27/11565* (2017.01)
*H01L 21/762* (2006.01)
*H01L 29/792* (2006.01)

(52) U.S. Cl.
CPC ........ *H01L 27/1157* (2013.01); *H01L 21/762* (2013.01); *H01L 27/11565* (2013.01); *H01L 29/66833* (2013.01); *H01L 29/792* (2013.01)

(58) Field of Classification Search
CPC ..................................................... H01L 21/762
See application file for complete search history.

(56) References Cited

U.S. PATENT DOCUMENTS

| 8,536,642 | B2 | 9/2013 | Ogawa | |
|---|---|---|---|---|
| 9,935,018 | B1* | 4/2018 | Xie | ................. H01L 21/823885 |
| 9,997,413 | B1* | 6/2018 | Leobandung | ... H01L 21/823487 |
| 2007/0252192 | A1* | 11/2007 | Mokhlesi | .............. H01L 27/115 257/315 |
| 2013/0023095 | A1 | 1/2013 | Nojima | |

(Continued)

FOREIGN PATENT DOCUMENTS

| JP | 2-135777 | 5/1990 |
|---|---|---|
| JP | 6-13627 | 1/1994 |

(Continued)

*Primary Examiner* — Moazzam Hossain
*Assistant Examiner* — Omar F Mojaddedi
(74) *Attorney, Agent, or Firm* — Kile Park Reed & Houtteman PLLC

(57) ABSTRACT

A NAND flash memory device having a facing bar and a method of fabricating the same are provided. The method includes forming one transistor or a plurality of stack transistors as cell transistors on two side surfaces of a facing bar to have transmission channels thereat. In this case, the height of the facing bar may be easily increased. Thus, not only a layout area of unit transistors including the cell transistors but also a layout area of cell strings may be minimized, and lengths of the transmission channels of the cell transistors may be sufficiently extended. As a result, according to the NAND flash memory device and the method of fabricating the same, the overall operating characteristics are improved.

6 Claims, 10 Drawing Sheets

(56) References Cited

U.S. PATENT DOCUMENTS

2016/0181377 A1\* 6/2016 Oh ................ H01L 29/4941
  438/421
2016/0211023 A1\* 7/2016 Zhang ................ G11C 11/5642

FOREIGN PATENT DOCUMENTS

KR    10-1287364    7/2013
KR    10-2014-0086647    7/2014

\* cited by examiner

NAND FLASH MEMORY DEVICE HAVING FACING BAR AND METHOD OF FABRICATING THE SAME

CROSS-REFERENCE TO RELATED APPLICATION

This application claims priority to and the benefit of Korean Patent Application No. 2017-0152296, filed on Nov. 15, 2017, the disclosure of which is incorporated herein by reference in its entirety.

BACKGROUND

1. Field of the Invention

The present invention relates to a NAND flash memory device and a method of fabricating the same, and more particularly, to a NAND flash memory device having a facing bar and a method of fabricating the device.

2. Discussion of Related Art

As shown in FIG. 1, a NAND flash memory device, which is one type of non-volatile memory device, includes a string array STARR in which a plurality of cell strings STG<1:m> are arranged. Each of the cell strings STG<1:m> includes a drain select transistor DST, a plurality of cell transistors MC<1:n>, and a source select transistor SST, which are connected in series between a corresponding one of bit lines BL<1:m> and a common source line CSL. In this case, a drain select signal XDS, word line selection signals WL<1:n>, and a source select signal XSS are applied to the drain select transistor DST, a corresponding one of the plurality of cell transistors MC<1:n>, and the source select transistor SST, respectively, to form transmission channels. Further, to improve characteristics of the NAND flash memory device, a dummy transistor (not shown) having a shape similar to that of the cell transistor MC may be located at an appropriate position of the cell string STG In this case, each of the cell transistors MC<1:n> is a transistor having a control gate CGT to which a signal for forming the transmission channel is applied and a trap gate TGT configured to trap charges of the transmission channel. In the present specification, the cell transistors MC<1:n> may be called a 'trap transistor'. Further, the drain select transistor DST and the source select transistor SST form the transmission channel having a control gate CGT to which a signal for forming the transmission channel is applied. The drain select transistor DST and the source select transistor SST are transistors devoid of trap gates and may be referred to as 'transmission transistors' in the present specification.

Meanwhile, NAND flash memory devices have lately become gradually highly integrated. In this case, in a conventional NAND flash memory device having a transmission channel formed on a planar surface, a channel length of a cell transistor MC is reduced. Thus, phenomena, such as a short channel effect, a leakage current of a silicon substrate, gate induced drain leakage (GIDL), drain induced barrier lowering (DIBL), program disturbances, and a rise in trap charge loss ratio, occur in the conventional NAND flash memory device. Problems, such as a variation in threshold voltage due to interference between adjacent cell transistors, occur.

SUMMARY OF THE INVENTION

The present invention is directed to a NAND flash memory device with improved overall operating characteristics by minimizing a layout area and easily extending lengths of transmission channels of transistors forming a cell string, and a method of fabricating the same.

According to an aspect of the present invention, there is provided a NAND flash memory device, including: a facing bar configured to protrude to have a predetermined width and height from a planar surface of a semiconductor substrate and configured to extend in a first direction which is a lateral direction, the facing bar being divided into a plurality of device forming sections by a plurality of active regions, wherein the plurality of active regions extend parallel with one another in a second direction of the lateral direction and are electrically isolated from one another, and the second direction intersects the first direction; and a first side structure and a second side structure provided on two side surfaces of the facing bar, each of the first side structure and the second side structure including a base electrode guard including a conductive material, the base electrode guard extending in the first direction to be provided on the active region, wherein the first side structure and the second side structure are divided into a plurality of first active structures and a plurality of second active structures to correspond to the plurality of device forming sections. Each of the plurality of first active structures and the plurality of second active structures includes a base transistor in which at least a portion of a transmission channel is provided on a side surface of the facing bar according to a voltage applied to a control gate, and the control gate is provided as a portion of the base electrode guard. Further, the base transistor of the first active structure and the base transistor of the second active structure, which correspond to one of the device forming sections, are provided as a portion of one cell string.

According to another aspect of the present invention, there is provided a method of fabricating a NAND flash memory device, the method including: forming an isolation trench in a semiconductor substrate and forming an active region; forming a facing bar on the semiconductor substrate in which the active region is formed; stacking a subsidiary material layer and a mold layer in contact with a side surface of the facing bar; removing the subsidiary material layer to form a mold; depositing a gate material on the side surface of the facing bar on which the mold is formed; etching the gate material deposited on the side surface of the facing bar to form a gate electrode of a transistor; and forming a capping layer on a region from which the gate material is etched to obtain an air gap by.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with the exemplary embodiments thereof, it will be apparent to those skilled in the art that various modifications can be made without departing from the spirit and scope of the invention.

Figure 1:
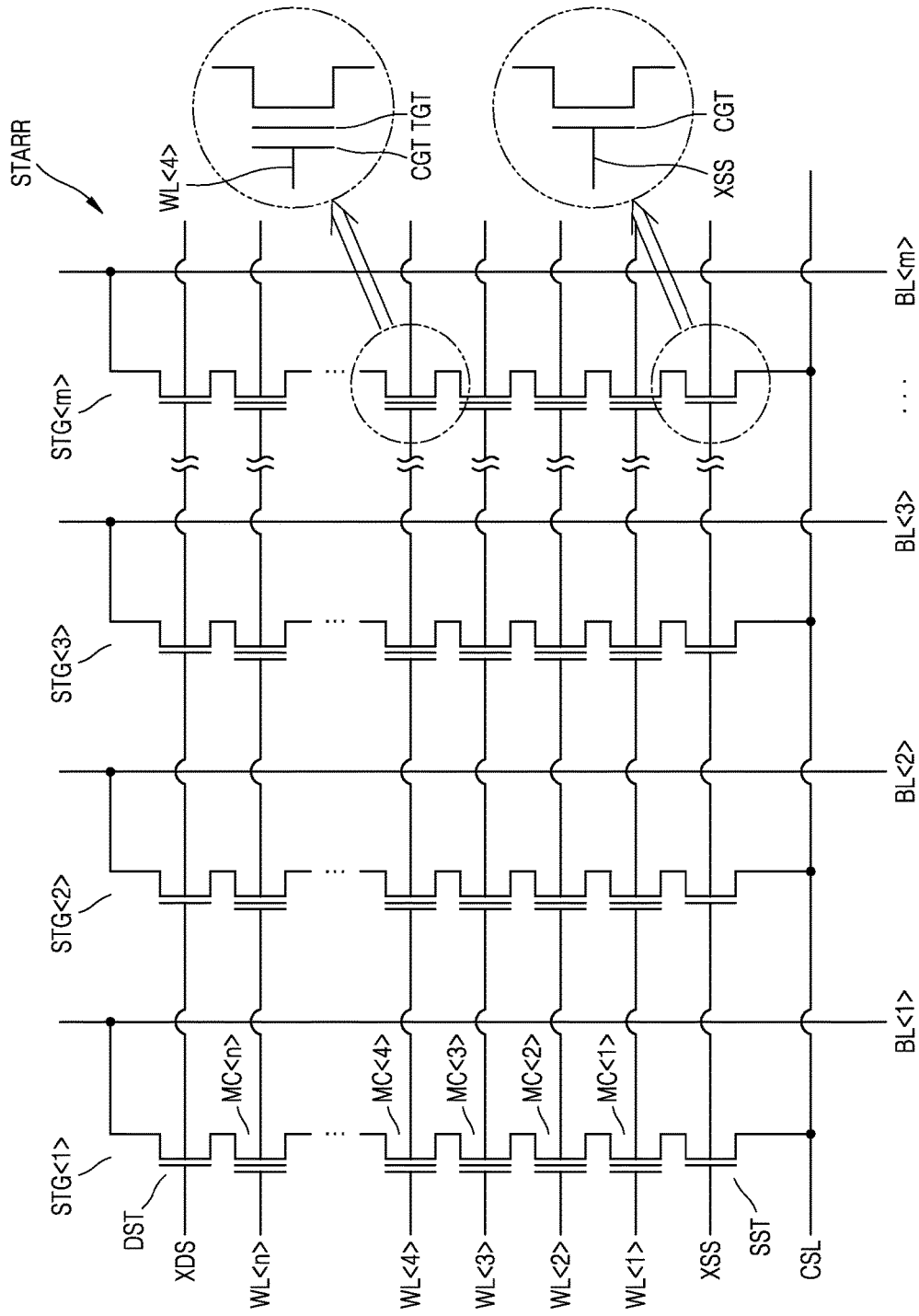
FIG. 1 is a view illustrating a string array of a typical NAND flash memory device.
Figure 2A:
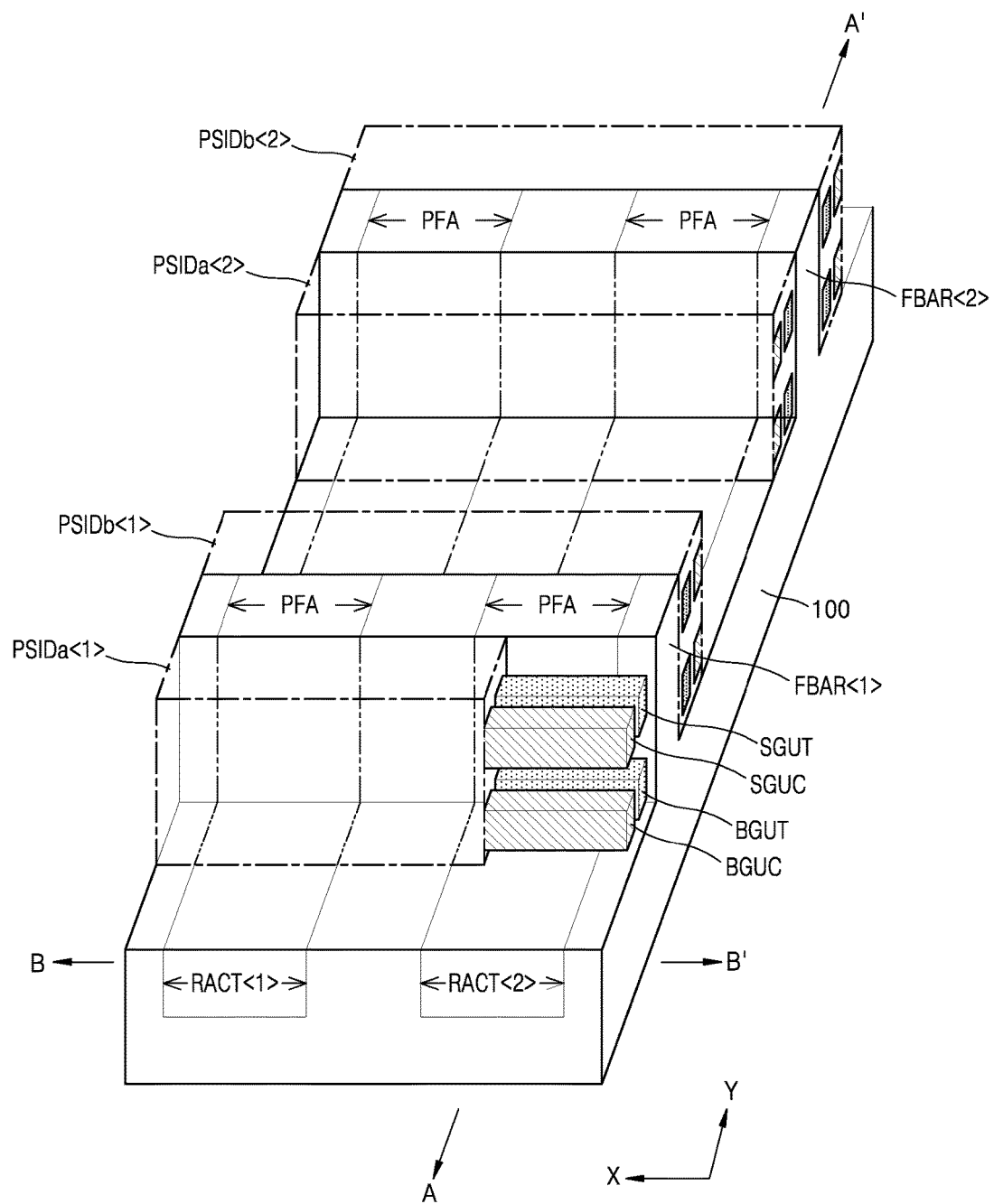
FIGS. 2A and 2B are conceptual views of a NAND flash memory device according to an exemplary embodiment of the present invention, which are respectively a perspective view and a plan view of a portion of a cell string array.
Figure 2B:
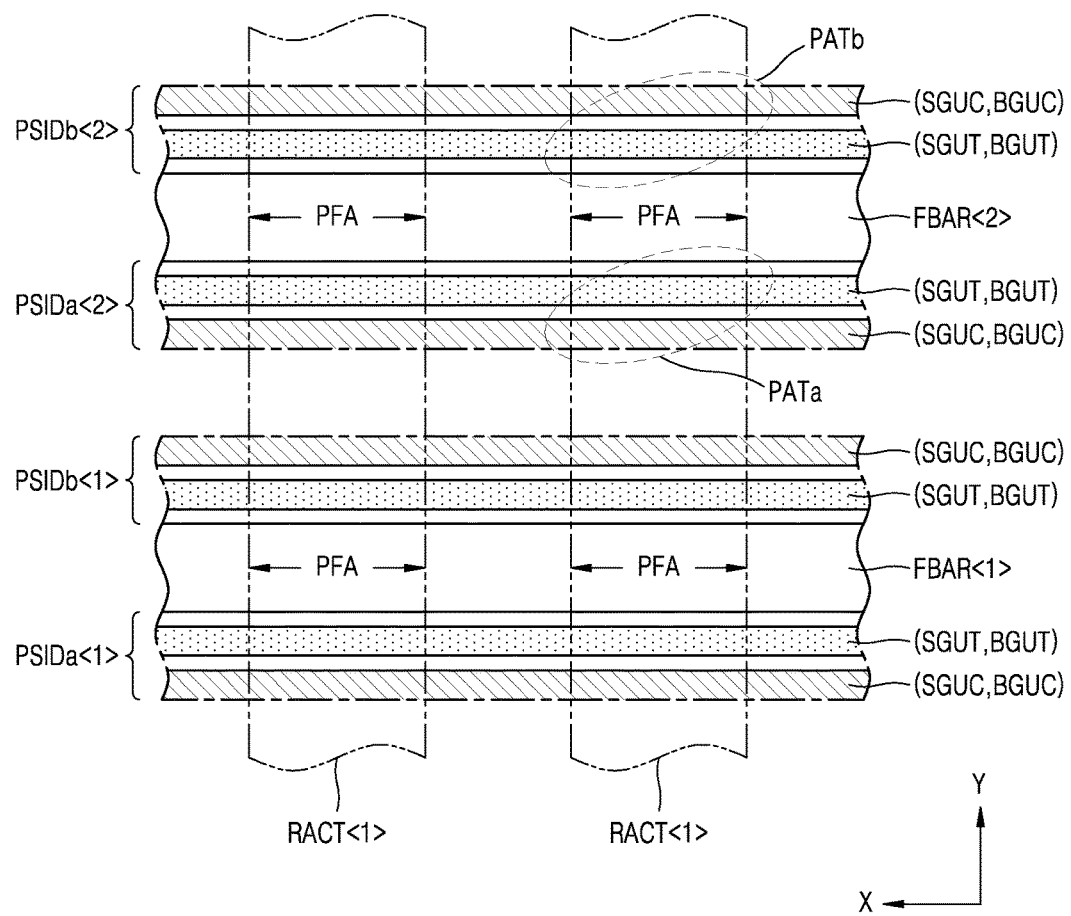

FIGS. 2A and 2B are conceptual views of a NAND flash memory device according to an exemplary embodiment of the present invention, which are respectively a perspective view and a plan view of a portion of a cell string array. In FIGS. 2A and 2B, for the sake of clarity, only main components are illustrated.

Referring to FIGS. 2A and 2B, the NAND flash memory device of the present invention includes a facing bar FBAR and first and second side structures PSIDa and PSIDb.

At least one facing bar FBAR is included in the NAND flash memory device according to the present invention. For example, a plurality of facing bars FBAR may be included in the NAND flash memory device according to the present invention. Further, the number of pairs of first and second side structures PSIDa and PSIDb corresponds to the number of facing bars FBAR.

The facing bar FBAR protrudes to have a predetermined width and height from a planar surface of a semiconductor substrate 100 and extends in a first direction(an X direction in the present embodiment). The facing bar FBAR is divided into a plurality of device forming sections PFA by a plurality of active regions RACT<1> and RACT<2>. Here, the plurality of active regions RACT<1> and RACT<2> extend parallel with one another in a second direction (a Y direction in the present embodiment), and are electrically isolated from one another. In this case, the 'first direction' and the 'second direction' intersect each other, preferably, intersect perpendicularly to each other.

The first side structure PSIDa and the second side structure PSIDb are respectively formed on two side surfaces of the facing bar FBAR. Each of the first side structure PSIDa and the second side structure PSIDb includes a base electrode guard BGUC, which includes a conductive material and extends in the 'first direction'.

In addition, in some embodiments, each of the first side structure PSIDa and the second side structure PSIDb further includes a base trap guard BGUT. In this case, the base trap guard BGUT is formed to extend in 'the first direction' between the base electrode guard BGUC and the side surface of the facing bar FBAR, which correspond to the base trap guard BGUT, and may trap charges.

For example, each of the first side structure PSIDa and the second side structure PSIDb further includes a stack electrode guard SGUC, which includes a conductive material, and a stack trap guard SGUT. In this case, the stack electrode guard SGUC is formed on the base electrode guard BGUC to extend in the 'first direction'. The stack trap guard SGUT is formed to extend in the 'first direction' between the stack electrode guard SGUC and the side surface of the facing bar FBAR, which correspond to the stack trap guard SGUT, and may trap charges.

In this case, the base electrode guard BGUC, the base trap guard BGUT, the stack electrode guard SGUC, and the stack trap guard SGUT are formed on and across the plurality of active regions RACT<1> and RACT<2>.

In addition, the first side structure PSIDa may be divided into a plurality of first active structures PATa corresponding to the plurality of device forming sections PFA. The second side structure PSIDb may be divided into a plurality of second active structures PATb corresponding to the plurality of device forming sections PFA.

In this case, the first active structure PATa and the second active structure PATb corresponding to one device forming section PFA form a pair.

Figure 3A:
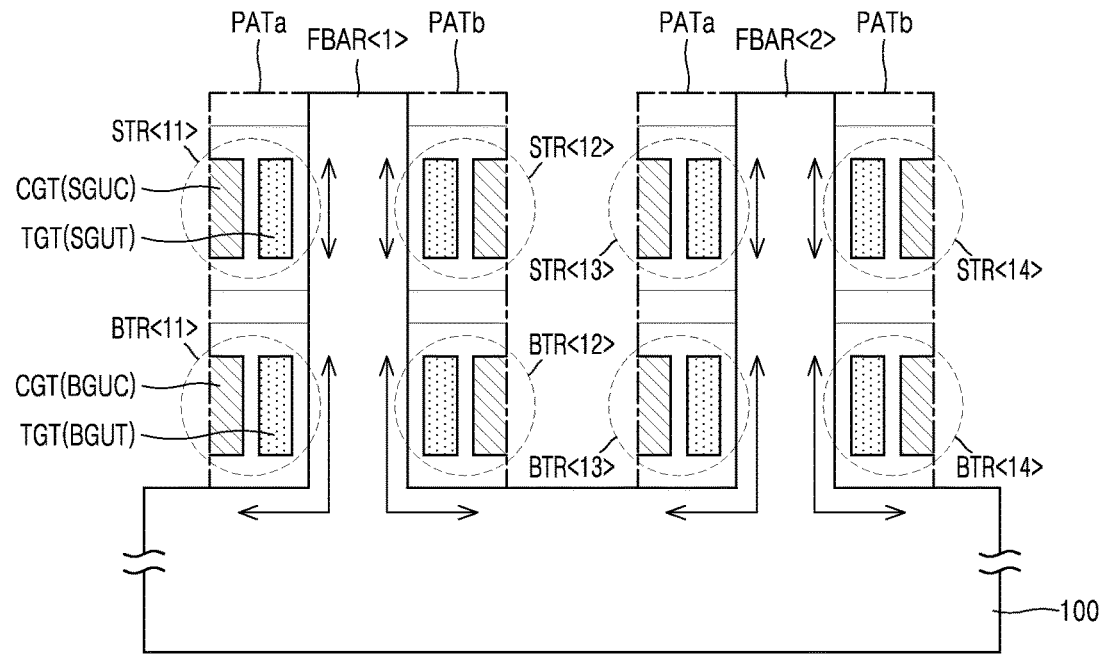
FIGS. 3A and 3B are respectively conceptual cross-sectional views for describing an example and another example of a pair of active structures of FIG. 2A, which are taken along line A-A' of FIG. 2A.
Figure 3B:
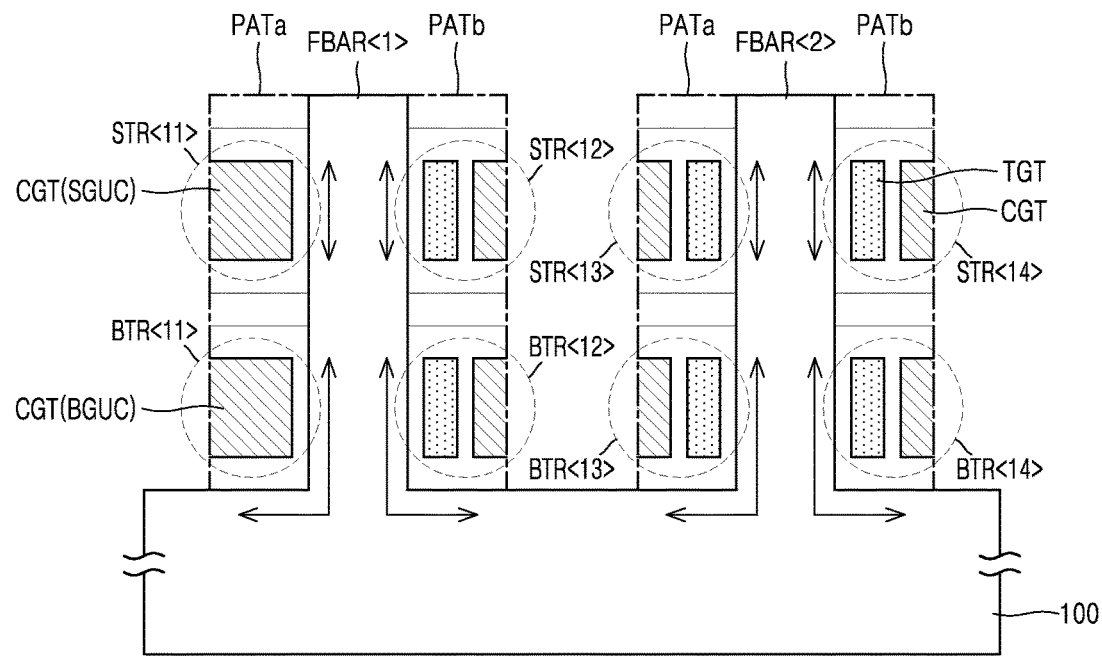

FIGS. 3A and 3B are respectively conceptual cross-sectional views for describing an example and another example of a pair of first and second active structures PATa and PATb of FIG. 2A, which are taken along line A-A' of FIG. 2A. In FIGS. 3A and 3B, for the sake of clarity, only main components are illustrated.

Referring to FIGS. 3A and 3B, the first and second active structures PATa and PATb, which form the pair, are formed on corresponding two side surfaces (left and right sides of the drawings) of the facing bar FBAR.

Furthermore, one transistor or at least two transistors which are stacked may be formed in each of the first and second active structures PATa and PATb.

In the present specification, examples in which two transistors are stacked in each of the first and second active structures PATa and PATb are representatively illustrated and described. In this case, a lowermost transistor may be referred to as a 'base transistor BTR'. Further, a transistor stacked on the base transistor BTR may be called a 'stack transistor STR'.

In this case, as shown in FIG. 3A, all the base transistors BTR<11>, BTR<12>, BTR<13>, and BTR<14> may be implemented as 'trap transistors', each of which includes a control gate CGT to which a voltage for forming a transmission channel is applied and a trap gate TGT configured to trap charges. All the base transistors BTR<11>, BTR<12>, BTR<13>, and BTR<14> may be applied as 'cell transistors MC' in a NAND flash memory device of the present invention.

In this case, the control gate CGT and the trap gate TGT of each of the base transistors BTR<11>, BTR<12>, BTR<13>, and BTR<14> are formed as portions of the base electrode guard BGUC and the base trap guard BGUT, which correspond to the control gate CGT and the trap gate TGT.

In addition, as shown in FIG. 3B, the base transistor BTR<11> and a stack transistor STR<11> formed on one side surface of the facing bar FBAR may be implemented as 'transmission transistors'. In this case, the base transistor BTR<11> and the stack transistor STR<11>, which are implemented as the transmission transistors, are formed to be gated at the same time point and may be applied as 'drain select transistors DST' or 'source select transistors SST' in the NAND flash memory device.

Furthermore, a transistor stacked on the base transistor BTR may be referred to as a 'stack transistor STR'. That is, stack transistors STR<11>, STR<12>, STR<13>, and STR<14> may be stacked on and connected in series to the corresponding base transistors BTR<11>, BTR<12>, BTR<13>, and BTR<14>.

In the exemplary embodiments of FIGS. 3A and 3B, each of the stack transistors STR<11>, STR<12>, STR<13>, and STR<14> may be implemented as a 'trap transistor' including a control gate CGT to which a voltage for forming a transmission channel is applied and a trap gate TGT configured to trap charges. All the stack transistors STR<11>, STR<12>, STR<13>, and STR<14> may be adopted as 'cell transistors MC' in the NAND flash memory device of the present invention.

In this case, the control gate CGT and the trap gate TGT of each of the stack transistors STR<11>, STR<12>, STR<13>, and STR<14>are formed as portions of the stack electrode guard SGUC and the stack trap guard SGUT, which correspond to the control gate CGT and the trap gate TGT.

In addition, in the present specification, two base transistors BTR<11>/BTR<12>, two base transistors BTR<13>/BTR<14>, two stack transistors STR<11>/STR<12>, and two stack transistors STR<13>/STR<14>, which are formed on a left side and a right side of the corresponding facing bars FBAR, may each be referred to as a "pair of transistors'.

Transmission channels of the base transistors BTR<11>, BTR<12>, BTR<13>, and BTR<14> and the stack transistors STR<11>, STR<12>, STR<13>, and STR<14> will be described with further reference to FIGS. 3A and 3B.

At least portions of the transmission channels of the base transistors BTR<11> to BTR<14> are formed on side surfaces of the facing bars FBAR that correspond to the at least portions of the transmission channels. That is, the transmission channels of the base transistors BTR<11> to BTR<14> are formed on the corresponding side surfaces of the facing bars FBAR and a surface of a semiconductor substrate 100.

Therefore, according to the NAND flash memory device of the present invention, the entire layout area may be minimized by minimizing a layout area for transistors such as the cell transistors MC.

In this case, the transmission channels of the pairs of stack transistors STR<11>/STR<12> and STR<13>/STR<14> are electrically connected to one another on the corresponding facing bars FBAR during operations. Further, the transmission channels of the pairs of stack transistors STR<11>/STR<12> and STR<13>/STR<14> are electrically connected to the transmission channels of the base transistors BTR<12> and BTR<13> formed on the adjacent facing bars FBAR through the lateral surface of the semiconductor substrate 100.

Figure 3C:
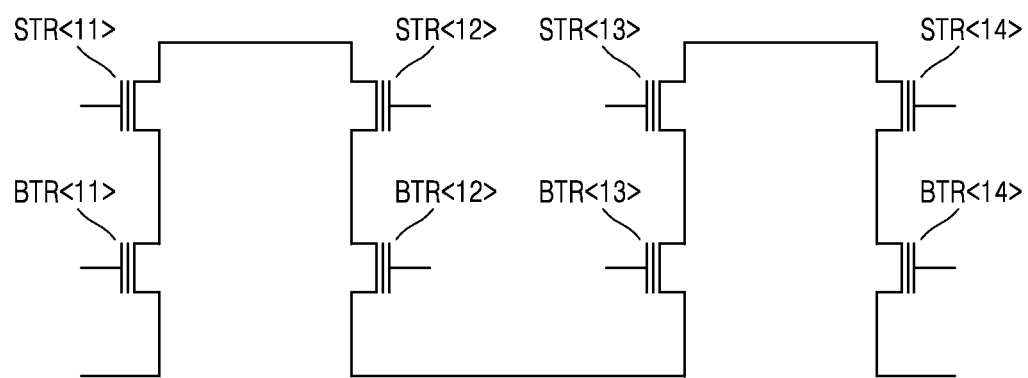
FIG. 3C is an equivalent circuit diagram of FIG. 3A.

Thus, as shown in FIG. 3C, the base transistors BTR<11>, BTR<12>, BTR<13>, and BTR<14> and the stack transistors STR<11>, STR<12>, STR<13>, and STR<14> may be connected in series to one another and used as a portion of one cell string STG Subsequently, a method of fabricating a NAND flash memory device according to an exemplary embodiment of the present invention will be described.

Figure 4:
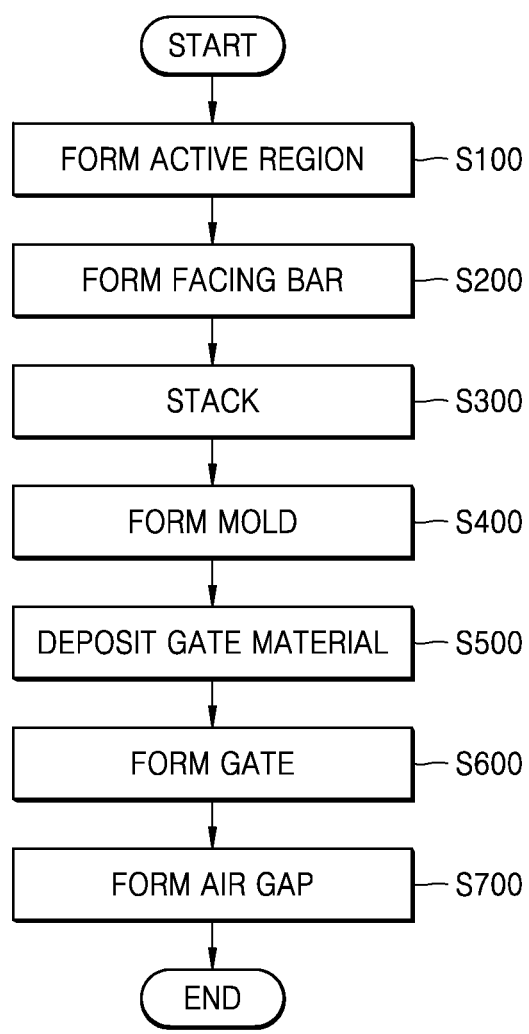
FIG. 4 is a flowchart of a method of fabricating a NAND flash memory device according to an exemplary embodiment of the present invention.
Figure 5A:
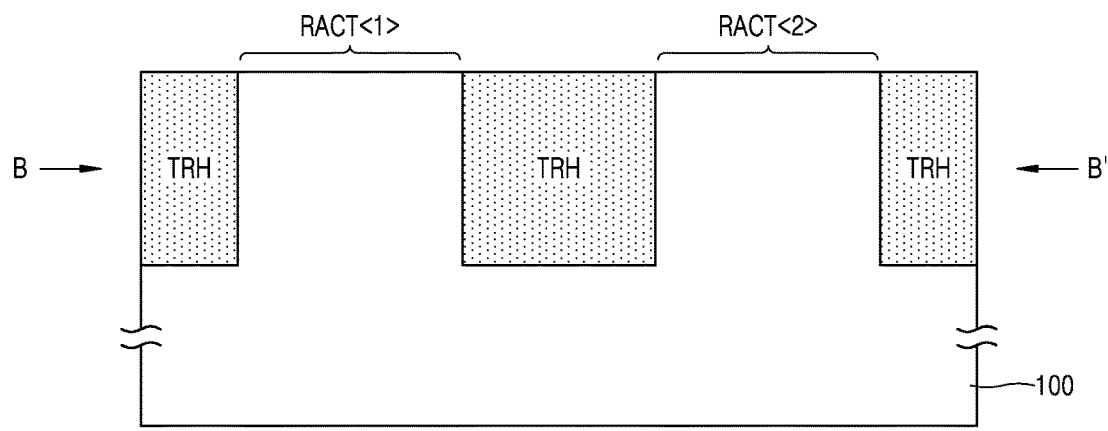
FIGS. 5A to 5G are cross-sectional views based on operations of the method of fabricating a NAND flash memory device according to the exemplary embodiment of the present invention.

FIG. 4 is a flowchart of a method of fabricating a NAND flash memory device according to an exemplary embodiment of the present invention. Further, FIGS. 5A to 5G are cross-sectional views based on operations of the method of fabricating a NAND flash memory device according to the exemplary embodiment of the present invention. In this case, it should be noted that FIG. 5A is a cross-sectional view taken along line B-B' of FIG. 2A, and FIGS. 5B to 5G are cross-sectional views taken along line A-A' of FIG. 2A.

In addition, in the present specification, an example in which all the base transistors BTR<11> to BTR<14> are implemented as 'trap transistors' is representatively illustrated and described.

Referring to FIG. 4, the method of fabricating the NAND flash memory device according to the present invention includes an active region forming operation (S100), a facing bar forming operation (S200), a stacking operation (S300), a mold forming operation (S400), a gate material depositing operation (S500), and a gate forming operation (S600). For example, the method of fabricating the NAND flash memory device according to the present invention further includes an air gap forming operation (S700).

As shown in FIG. 5A, in the active region forming operation (S100), isolation trenches TRH are formed in a semiconductor substrate 100. In this case, a process of forming the isolation trenches TRH may be performed using a photomask configured to mask the active regions RACT<1> and RACT<2>. Subsequently, the isolation trenches TRH are filled with an insulating material, such as an oxide layer, to obtain the active regions RACT<1> and RACT<2>.

Figure 5B:
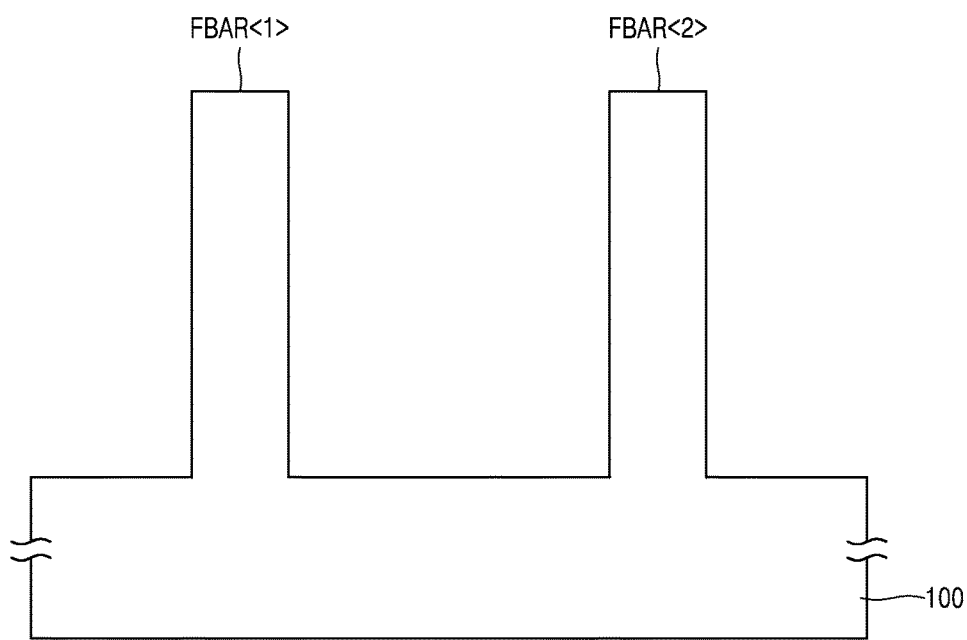

As shown in FIG. 5B, in the facing bar forming operation (S200), the semiconductor substrate 100 in which the active region RACT is formed is etched to form the facing bars FBAR<1> and FBAR<2>. In this case, the facing bars FBAR<1> and FBAR<2> are formed to have a predetermined width and height and extend in the first direction which is the lateral direction. Further, a process of forming the facing bars FBAR<1> and FBAR<2> may be performed using a photomask configured to mask regions of the facing bars FBAR<1> and FBAR<2>.

Although not shown, channel impurities for forming a junction of a transistor and a transmission channel, which will be subsequently formed, may be implanted into the facing bars FBAR<1> and FBAR<2> and a lateral surface of the semiconductor substrate 100.

Due to the implantation of the channel impurities, a junction of the base transistor BTR<12> (see FIGS. 3A and 3B) may be electrically connected to a junction of the base transistor BTR<13> (see FIGS. 3A and 3B). Further, junctions of pairs of uppermost stack transistors STR<11>/STR<12> and STR<13>/STR<14> (see FIGS. 3A and 3B) may also be electrically connected to one another by using the same facing bars FBAR<1> and FBAR<2>.

Figure 5C:
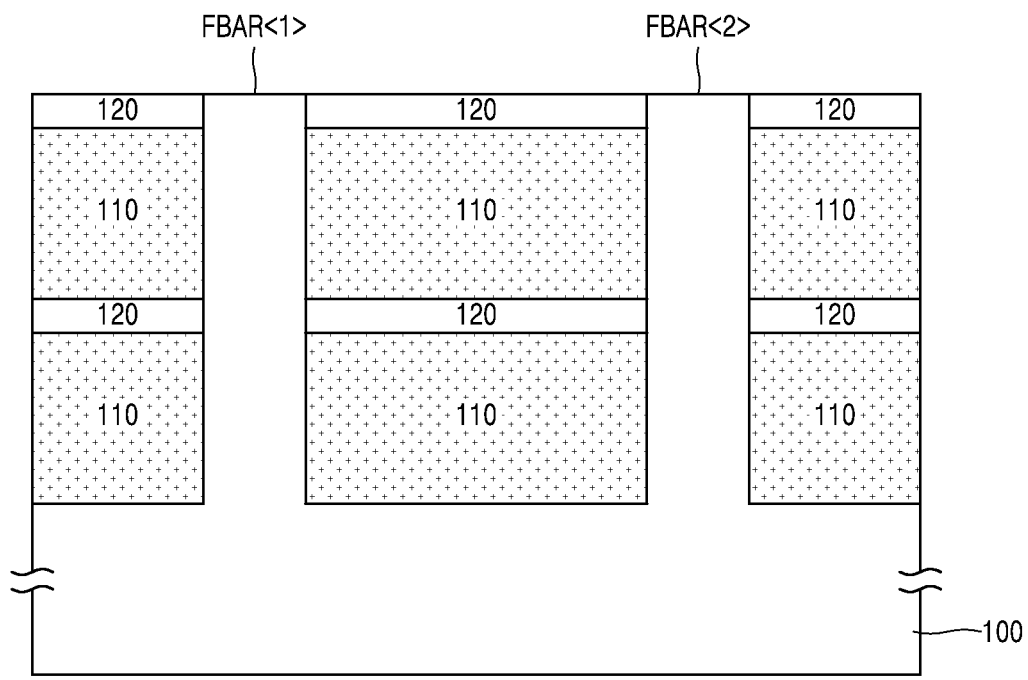

As shown in FIG. 5C, in the stacking operation (S300), subsidiary material layers 110 and mold layers 120 are alternately stacked according to a stack number on side surfaces of the facing bars FBAR<1> and FBAR<2>. Here, the 'stack number' is the number of stacked transistors and corresponds to the sum of the numbers of the base transistors BTR and the stack transistors STR formed on one side surfaces of the facing bars FBAR<1> and FBAR<2>.

In this case, a silicon nitride film may be used as the subsidiary material layer 110, and a silicon oxide film may be used as the mold layer 120.

Figure 5D:
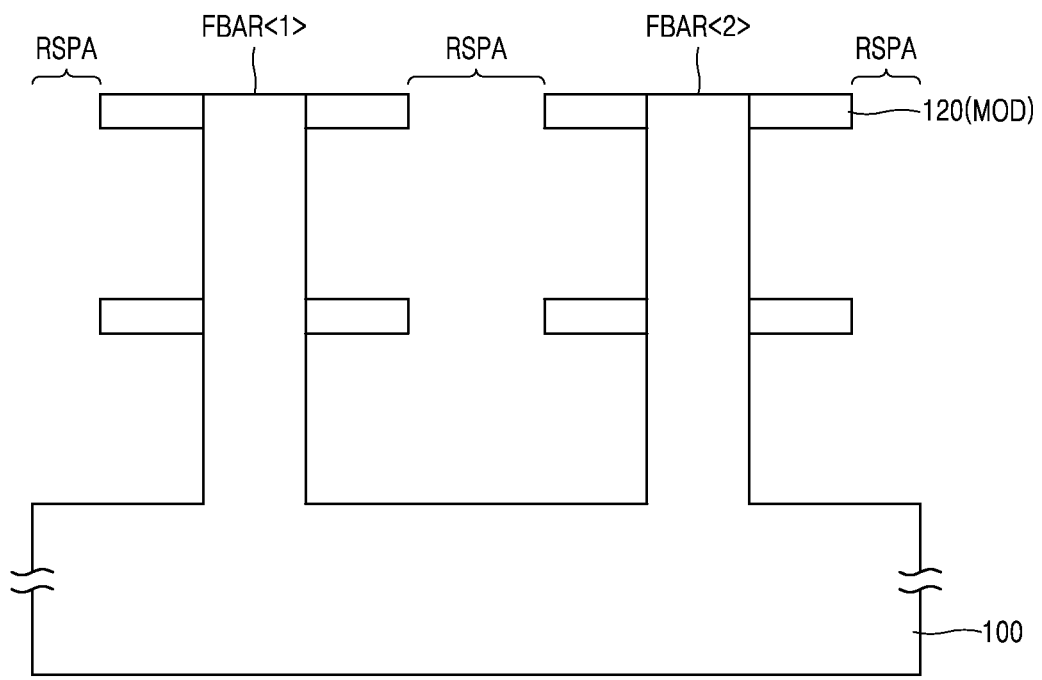

In the mold forming operation (S400), the subsidiary material layer 110 stacked in the stacking operation (S300) is removed. As a result, as shown in FIG. 5D, in the mold forming operation (S400), the mold layer 120 remains to form molds MOD.

The process of removing the subsidiary material layer 110 may be performed using an etching process after a predetermined space region RSPA between the facing bars FBAR<1> and FBAR<2> is obtained using an etching process.

Figure 5E:
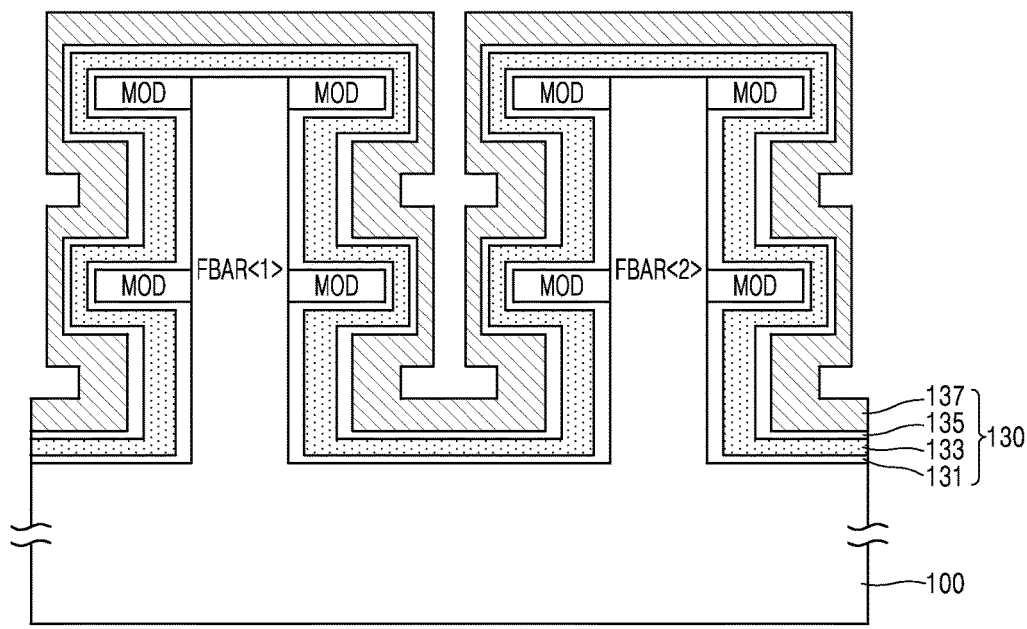

As shown in FIG. 5E, in the gate material depositing operation (S500), a gate material 130 is deposited on the side surfaces of the facing bars FBAR<1> and FBAR<2> on which the molds MOD are formed. In this case, the deposition of the gate material 130 includes sequentially depositing a channel oxide film 131, a trap electrode material 133, a dielectric film 135, and a control electrode material 137 on the side surfaces of the facing bars FBAR<1> and FBAR<2>.

In this case, the channel oxide film 131 may be formed of a thin silicon oxide film, and the trap electrode material 133 may be formed of a silicon nitride film. Further, the dielectric film 135 may be formed of a dielectric material having a high dielectric constant, and the control electrode material 137 may be formed of a highly conductive material such as doped polysilicon (doped poly-Si), tungsten (W), or titanium (Ti).

For reference, when the base transistor BTR is a 'transmission transistor', the formation of the trap electrode material 133 may be omitted.

Since the method of depositing the gate material 130 is easily performed by one of ordinary skill in the art, detailed descriptions thereof are omitted.

Figure 5F:
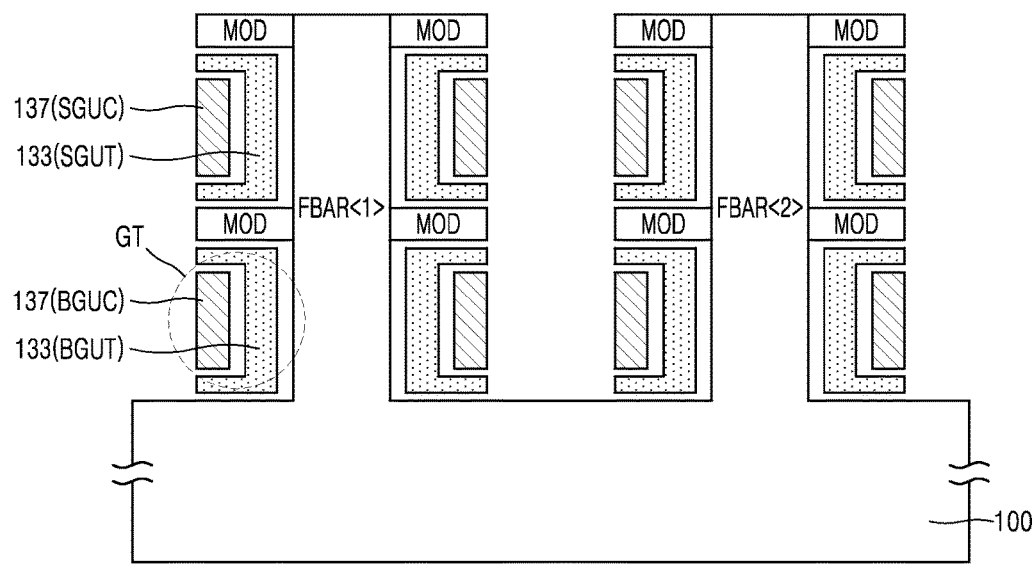

As shown in FIG. 5F, in the gate forming operation (S600), the gate material 130 deposited on side surfaces of the facing bars FBAR<1> and FBAR<2> is etched to form gate electrodes GT of transistors.

In this case, the trap electrode material 133 remaining on the side surfaces of the facing bars FBAR<1> and FBAR<2> forms the base trap guard BGUT (see FIGS. 2A and 2B) and the stack trap guard SGUT (see FIGS. 2A and 2B). Further, the control electrode material 137 remaining on the side surfaces of the facing bars FBAR<1> and FBAR<2> forms the base electrode guard BGUC (see FIGS. 2A and 2B) and the stack electrode guard SGUC (see FIGS. 2A and 2B).

The process of etching the gate material 130 may be performed using the mold layer 120 as a stopper.

Figure 5G:
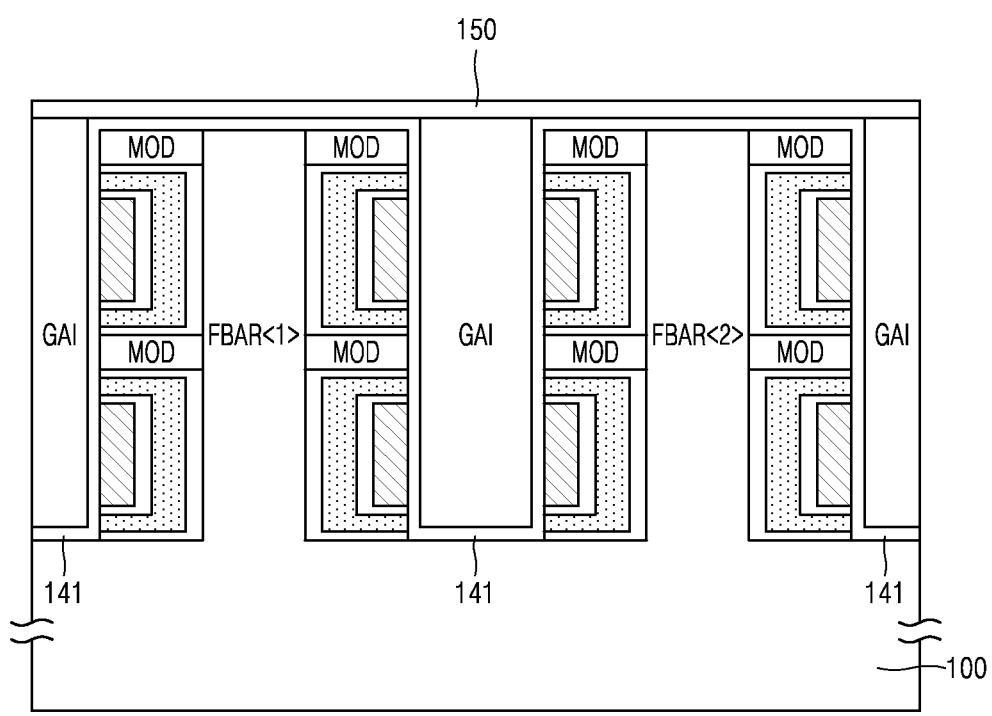

As shown in FIG. 5G in the air gap forming operation (S700), a capping layer 150 is formed on a region from which the gate material 130 is etched, thereby obtaining an air gap GAI.

In this case, the capping layer 150 may be formed using the following method. Specifically, after an oxide film 141 is formed, a spin-on hardmask (SOH) (not shown) is applied. Thereafter, the SOH is planarized, and an atomic layer deposition (ALD) film 150 is then formed. Subsequently, the SOH is removed using an ashing process to form the capping layer 150. Thus, the air gap GAI is obtained.

Meanwhile, processes of forming a contact and a metal (e.g., a bit line BL and a common source line CSL) configured to provide required signals and/or voltages may be easily performed by one of ordinary skill in the art. In particular, in a NAND flash memory device in which a plurality of transistors are stacked, it will be apparent to one of ordinary skill in the art that the contact and the metal may be easily formed by extending a control gate used as a word line in a staircase form. Therefore, in the present specification, detailed descriptions of the processes of forming the contact and the metal are omitted.

To sum up, in a NAND flash memory device and a method of fabricating the same according to the present invention, one transistor or a plurality of stack transistors are formed as cell transistors on two side surfaces of a facing bar to have transmission channels thereat. In this case, the height of the facing bar may be easily increased. Thus, not only a layout area of unit transistors including the cell transistor but also a layout area of cell strings can be minimized, and lengths of the transmission channels can be sufficiently extended.

As a result, in the NAND flash memory device and the method of fabricating the same according to the present invention, phenomena, such as a short channel effect, a leakage current of a silicon substrate, gate induced drain leakage (GIDL), drain induced barrier lowering (DIBL), and program disturbances, can be greatly alleviated, and a trap charge loss ratio can be greatly improved.

In addition, in the NAND flash memory device and the method of fabricating the same as described above, the width of facing bars can be easily controlled, and an air gap can be easily formed between the facing bars. Thus, in the NAND flash memory device and the method of fabricating the same according to the present invention, a variation in threshold voltage due to interference between adjacent cell transistors can be inhibited to reduce the overall distribution of threshold voltages of cell transistors and improve characteristics.

Furthermore, in the NAND flash memory device and the method of fabricating the same as described above, a considerable number of processes, such as a deposition process and an etching process, are performed using facing bars. Therefore, in the NAND flash memory device and the method of fabricating the same according to the present invention, since additional photomask processes and additional materials are not required, fabrication costs are minimized.

As described above, in a NAND flash memory device and a method of fabricating the same according to the present invention, one transistor or a plurality of vertically stacked transistors are formed as cell transistors on two side surfaces of a facing bar to have transmission channels thereat. Thus, a layout area can be minimized, and lengths of the transmission channels of the cell transistors can be sufficiently extended. As a result, the NAND flash memory device and the method of fabricating the same of the present invention can improve the overall operating characteristics.

It will be apparent to those skilled in the art that various modifications may be made to the above-described exemplary embodiments of the present invention without departing from the spirit or scope of the invention. Thus, it is intended that the present invention covers all such modifications provided they come within the scope of the appended claims and their equivalents.

What is claimed is:

1. A NAND flash memory device comprising:
   a facing bar configured to protrude to have a predetermined width and height from a planar surface of a semiconductor substrate and configured to extend in a first direction which is a horizontal direction with respect to a horizontal surface of the semiconductor substrate, the facing bar being divided into a plurality of device forming sections by a plurality of active regions, wherein the plurality of active regions extend parallel with one another in a second direction of the horizontal direction and are electrically isolated from one another, and the second direction intersects the first direction; and
   a first side structure and a second side structure provided on two side surfaces of the facing bar, each of the first side structure and the second side structure including a base electrode guard including a conductive material, the base electrode guard extending in the first direction to be provided on the plurality of active regions, wherein the first side structure and the second side structure are divided into a plurality of first active structures and a plurality of second active structures to correspond to the plurality of device forming sections, wherein each of the plurality of first active structures and the plurality of second active structures comprises a base transistor in which at least a portion of a base transmission channel is provided on a side surface of the facing bar according to a voltage applied to a control gate, and the control gate is provided as a portion of the base electrode guard, wherein the base transistor of the first active structures and the base transistor of the second active structures, which correspond to one of the device forming sections, are provided as a portion of one cell string.

2. The device of claim 1, wherein the base transmission channel of the base transistor is provided on the side surface of the facing bar and the planar surface of the semiconductor substrate.

3. The device of claim 1, wherein each of the first side structure and the second side structure further comprises a base trap guard provided between the base electrode guard and the side surface of the facing bar to extend in the first direction, and configured to trap charges, wherein the base transistor is a trap transistor having a trap gate provided as a portion of the base trap guard.

4. The device of claim 1, wherein each of the plurality of first side structures and the plurality of second side structures further comprises:

a stack electrode guard including a conductive material and provided on the base electrode guard to extend in the first direction; and a stack trap guard provided between the stack electrode guard and the side surface of the facing bar to extend in the first direction, the stack trap guard capable of trapping charges, wherein each of the plurality of first active structures and the plurality of second active structures further comprises a stack transistor in which a stack transmission channel is provided on the side surface of the facing bar according to a voltage applied to a control gate, and the control gate is provided as a portion of the stack electrode guard, wherein the stack transistor is a trap transistor that is connected in series to the corresponding base transistor and provided as a portion of the one cell string, the trap transistor having a trap gate provided as a portion of the stack trap guard.

5. A method of fabricating a NAND flash memory device, the method comprising:

forming an isolation trench and forming an active region in a semiconductor substrate;

forming a facing bar on the semiconductor substrate in which the active region is subsequently formed;

stacking a subsidiary material layer and a mold layer in contact with a side surface of the facing bar;

removing the subsidiary material layer to form a mold;

depositing a gate material on the side surface of the facing bar on which the mold is formed; and etching the gate material deposited on the side surface of the facing bar to form a gate electrode of a transistor, wherein the facing bar is formed to extend in a horizontal direction with respect to a horizontal surface of the semiconductor substrate.

6. The method of claim 5, further comprising forming a capping layer on a region, from which the gate material is etched, to obtain an air gap.

* * * * *